United States Patent
Takeuchi et al.

(10) Patent No.: US 10,580,851 B2
(45) Date of Patent: Mar. 3, 2020

(54) METHOD FOR MANUFACTURING COMPOUND SEMICONDUCTOR DEVICE AND COMPOUND SEMICONDUCTOR DEVICE

(71) Applicant: DENSO CORPORATION, Kariya, Aichi-pref. (JP)

(72) Inventors: Yuichi Takeuchi, Kariya (JP); Atsuya Akiba, Kariya (JP); Katsumi Suzuki, Nagakute (JP); Yusuke Yamashita, Nagakute (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/069,927

(22) PCT Filed: Jan. 19, 2017

(86) PCT No.: PCT/JP2017/001772
§ 371 (c)(1),
(2) Date: Jul. 13, 2018

(87) PCT Pub. No.: WO2017/145594
PCT Pub. Date: Aug. 31, 2017

(65) Prior Publication Data
US 2019/0035883 A1 Jan. 31, 2019

(30) Foreign Application Priority Data

Feb. 23, 2016 (JP) .................... 2016-032291

(51) Int. Cl.
*H01L 21/02* (2006.01)
*H01L 29/06* (2006.01)
(Continued)

(52) U.S. Cl.
CPC ........ *H01L 29/063* (2013.01); *H01L 21/0243* (2013.01); *H01L 21/0262* (2013.01);
(Continued)

(58) Field of Classification Search
CPC ......... H01L 21/02433; H01L 21/02609; H01L 21/02576; H01L 21/02579;
(Continued)

(56) References Cited

U.S. PATENT DOCUMENTS

| | | | | |
|---|---|---|---|---|
| 3,956,037 A | * | 5/1976 | Ishii | ........................ C30B 25/02 438/495 |
| 5,065,200 A | * | 11/1991 | Bhat | ...................... B82Y 20/00 257/15 |

(Continued)

FOREIGN PATENT DOCUMENTS

JP        2015-141921 A        8/2015

OTHER PUBLICATIONS

English language machine translation of JP 2015-141921A obtained from Espacent. (Year: 2015).*

*Primary Examiner* — Yu Chen
(74) *Attorney, Agent, or Firm* — POSZ Law Group, PLC

(57) ABSTRACT

A method for manufacturing a compound semiconductor device includes: providing a semiconductor substrate that includes a foundation layer; forming a deep trench in the foundation layer; and filling the deep trench with a deep layer having a second conductive type and a limiting layer having the first conductive type. In the filling the deep trench, growth of the deep layer from a bottom of the deep trench toward an opening inlet of the deep trench and growth of the limiting layer from a side face of the deep trench are achieved by: dominant epitaxial growth of a second conductive type layer over a first conductive type layer on the bottom of the deep trench; and dominant epitaxial growth of the first conductive type layer over the second conductive type layer on the side face of the deep trench, based on plane orientation dependency of the compound semiconductor during epitaxial growth.

9 Claims, 14 Drawing Sheets

(51) Int. Cl.
*H01L 29/16* (2006.01)
*H01L 29/78* (2006.01)
*H01L 29/872* (2006.01)
*H01L 21/265* (2006.01)
*H01L 29/66* (2006.01)
*H01L 21/04* (2006.01)
*H01L 29/10* (2006.01)
H01L 29/20 (2006.01)

(52) U.S. Cl.
CPC .. *H01L 21/02378* (2013.01); *H01L 21/02447* (2013.01); *H01L 21/02494* (2013.01); *H01L 21/02516* (2013.01); *H01L 21/02529* (2013.01); *H01L 21/02573* (2013.01); *H01L 21/02639* (2013.01); *H01L 21/046* (2013.01); *H01L 21/049* (2013.01); *H01L 21/0475* (2013.01); *H01L 21/265* (2013.01); *H01L 29/0619* (2013.01); *H01L 29/1095* (2013.01); *H01L 29/1608* (2013.01); *H01L 29/6606* (2013.01); *H01L 29/66068* (2013.01); *H01L 29/78* (2013.01); *H01L 29/7813* (2013.01); *H01L 29/872* (2013.01); H01L 29/2003 (2013.01)

(58) Field of Classification Search
CPC ........... H01L 21/02573; H01L 21/0475; H01L 21/0257; H01L 21/02529; H01L 21/0455; H01L 29/045; H01L 29/0623; H01L 29/0634; H01L 29/66068; H01L 29/6606; H01L 29/66734; H01L 29/7813; H01L 29/66143; H01L 29/872; H01L 29/1608; H01L 21/02363; H01L 21/02378; H01L 21/02447; H01L 21/02516; H01L 21/02639

See application file for complete search history.

(56) References Cited

U.S. PATENT DOCUMENTS

| | | | | |
|---|---|---|---|---|
| 5,476,811 | A * | 12/1995 | Fujii | H01S 5/2238 117/108 |
| 2005/0233539 | A1* | 10/2005 | Takeuchi | H01L 29/045 438/400 |
| 2009/0200559 | A1* | 8/2009 | Suzuki | H01L 29/086 257/77 |
| 2009/0261350 | A1* | 10/2009 | Yamamoto | H01L 29/0623 257/77 |
| 2010/0059849 | A1* | 3/2010 | Quddus | H01L 21/28537 257/476 |
| 2011/0129990 | A1* | 6/2011 | Mandrekar | H01L 21/2256 438/558 |
| 2011/0133211 | A1* | 6/2011 | Malhan | H01L 29/66068 257/77 |
| 2011/0287613 | A1* | 11/2011 | Liu | H01L 21/0243 438/478 |
| 2014/0145212 | A1* | 5/2014 | Takeuchi | H01L 29/66068 257/77 |
| 2014/0225217 | A1* | 8/2014 | Kitamura | H01L 29/0688 257/487 |
| 2016/0104794 | A1 | 4/2016 | Takeuchi et al. | |

* cited by examiner

METHOD FOR MANUFACTURING COMPOUND SEMICONDUCTOR DEVICE AND COMPOUND SEMICONDUCTOR DEVICE

CROSS REFERENCE TO RELATED APPLICATIONS

This application is a U.S. national phase of International Application No. PCT/JP2017/001772 filed on Jan. 19, 2017, and is based on Japanese Patent Application No. 2016-32291 filed on Feb. 23, 2016, the disclosures of which are incorporated herein by reference.

TECHNICAL FIELD

The present disclosure relates to a method for manufacturing a compound semiconductor device, and a compound semiconductor device, the device including a compound semiconductor such as silicon carbide (hereinafter referred to as SiC) and gallium nitride (hereinafter referred to as GaN).

BACKGROUND ART

Various types of compound semiconductor device that contains a compound semiconductor, such as SiC and GaN, have been conventionally proposed. These compound semiconductor devices include a vertical switching element, such as a vertical metal-oxide-semiconductor field-effect transistor (MOSFET) having an inverted type trench gate structure.

For example, the vertical MOSFET having the inverted type trench gate structure causes such an action that applies a gate voltage to a gate electrode inside a trench to form a channel in a p-type base area located on a trench side face, and produces an electrical current flowing between a drain and a source via the channel thus formed.

Patent Literature 1 describes a vertical MOSFET configured as above and having a structure capable of implementing measures for securing inductive load resistance. More specifically, for manufacturing this structure, a deep p-type layer that reaches deeper than a p-type base area is formed. Avalanche breakdown is caused preferentially on a bottom face of the deep p-type layer. Surge energy is extractable in this state along a route where a parasitic transistor is difficult to operate. Accordingly, sufficient inductive load resistance is obtainable. In case of a deep p-type layer extending deep, however, an n$^-$-type drift layer at a junction field effect transistor (JFET) is depleted by the presence of a depletion layer extending from the deep p-type layer toward a drift layer. In this condition, JFET resistance increases. According to Patent Literature 1, therefore, an n-type limiting layer is provided at a side face position of the deep p-type layer other than the bottom face side thereof to limit an extension amount of the depletion layer extending from the side face of the deep p-type layer, and thereby reduce a rise of JFET resistance.

PRIOR ART LITERATURE

Patent Literature

Patent literature 1: JP 2015-141921 A

SUMMARY OF INVENTION

Patent Literature 1 described above does not disclose a manufacturing method capable of accurately forming the n-type limiting layer on the side face of the deep p-type layer. Accordingly, it has been demanded to accurately forming the n-type limiting layer on the side face of the deep p-type layer.

While a vertical switching element such as a vertical MOSFET has been presented herein by way of example of the compound semiconductor device including the deep p-type layer, a similar configuration is applicable to a junction barrier diode (hereinafter referred to as JBS) and like devices. Accordingly, description of the vertical switching element is similarly applicable to a JBS and like devices.

It is an object of the present disclosure to provide a method for manufacturing a compound semiconductor device capable of accurately manufacturing a limiting layer on a side face of a deep layer.

According to an aspect of the present disclosure, a method for manufacturing a compound semiconductor device includes: providing a semiconductor substrate that includes a foundation layer having a first conductive type and formed of a compound semiconductor; forming a deep trench in the foundation layer; and filling the deep trench with a deep layer having a second conductive type and a limiting layer having the first conductive type. The deep trench is filled with the deep layer and the limiting layer by: introducing dopant gas that contains first conductive type dopant, dopant gas that contains second conductive type dopant, and material gas of the compound semiconductor into an epitaxial growth device; forming the deep layer from a bottom of the deep trench toward an opening inlet of the deep trench; and causing epitaxial growth of the limiting layer on a side face of the deep trench. The limiting layer limits a depletion layer that extends from a side face of the deep layer to the foundation layer.

According to the manufacturing method, in the filling the deep trench, growth of the deep layer from the bottom of the deep trench toward the opening inlet of the deep trench and growth of the limiting layer from the side face of the deep trench are achieved by: dominant epitaxial growth of a second conductive type layer over a first conductive type layer on the bottom of the deep trench; and dominant epitaxial growth of the first conductive type layer over the second conductive type layer on the side face of the deep trench, based on plane orientation dependency of the compound semiconductor during epitaxial growth.

As described above, the dopant gas containing the first conductive type dopant, the dopant gas containing the second conductive type dopant, and the material gas of the compound semiconductor are introduced to simultaneously form the deep layer and the limiting layer. More specifically, by utilizing plane orientation dependency of each of a first conductive type SiC layer and a second conductive type SiC layer during epitaxial growth, the deep layer is formed on the bottom of the deep trench, and the limiting layer is formed on the side face of the deep trench. In this manner, accurate formation of a structure that includes the limiting layer on the side face of the deep layer is achievable.

DESCRIPTION OF EMBODIMENTS

Embodiments according to the present disclosure are hereinafter described with reference to the drawings. In the respective embodiments described herein, identical or equivalent parts are given identical reference numbers.

(First Embodiment)

A first embodiment is now described. A compound semiconductor device described by way of example herein is an SiC semiconductor device that includes a vertical MOSFET having an inverted type trench gate structure.

Figure 1:
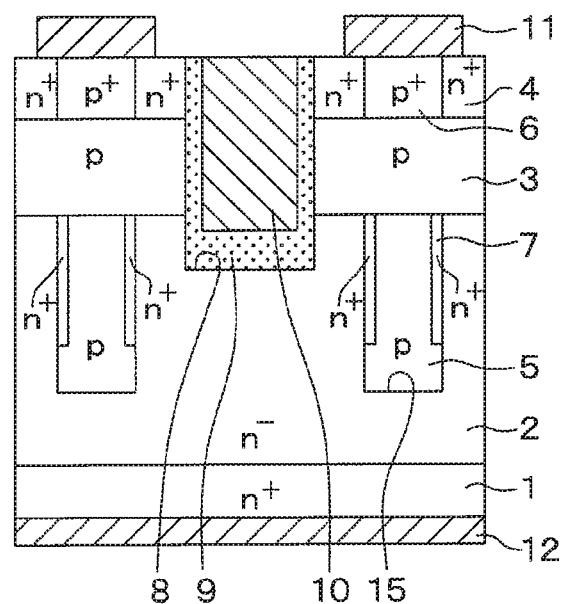
FIG. 1 is a cross-sectional view of an SiC semiconductor device including a vertical MOSFET according to a first embodiment.

An SiC semiconductor device illustrated in FIG. 1 includes a vertical MOSFET having a trench gate structure and disposed in a cell area. The SiC semiconductor device has an outer peripheral resistant structure (not shown) disposed in an outer peripheral area surrounding the cell area.

The SiC semiconductor device has a semiconductor substrate that includes an $n^+$-type substrate 1 constituting a high-concentration impurity layer containing SiC, and an $n^-$-type drift layer 2 disposed on a front face side of the $n^+$-type substrate 1 and containing SiC having an impurity concentration lower than the impurity concentration of the $n^+$-type substrate 1. For example, the $n^+$-type substrate 1 has an n-type impurity concentration of $1.0 \times 10^{19}/cm^3$, and a front face constituted by (0001) Si face. For example, the $n^-$-type drift layer 2 has an n-type impurity concentration in a range from $0.5 \times 10^{16}/cm^3$ to $2.0 \times 10^{16}/cm^3$.

A base area 3 is formed in an upper layer part of the $n^-$-type drift layer 2. According to the present embodiment, the base area 3 contains a p-type SC having an impurity concentration higher than an impurity concentration of the $n^-$-type drift layer 2. For example, the base area 3 according to the present embodiment has a p-type impurity concentration of approximately $2.0 \times 10^{17}/cm^3$, and a thickness of 300 nm.

An $n^+$-type source area 4 is further formed in an upper layer part of the base area 3. A p-type deep layer 5 is further formed in such a shape as to extend from a face of the $n^-$-type drift layer 2 adjacent to the base area 3 toward the $n^+$-type substrate 1 while being in contact with a bottom of the base area 3. A $p^+$-type contact layer 6 is further formed in such a shape as to extend from a front face of the $n^+$-type source area 4, penetrate the $n^+$-type source area 4, and reach the base area 3.

The $n^+$-type source area 4 is disposed on both sides of a trench gate structure described below. The p-type deep layer 5 is formed to have a predetermined distance from the trench gate structure, and reaches a position deeper than the trench gate structure. More specifically, a deep trench 15 formed below the base area 3 extends from a front face of the $n^-$-type drift layer 2. The p-type deep layer 5 is formed inside the deep trench 15. For example, the deep trench 15 has a depth at an aspect ratio of 2 or larger. A front layer part of the $n^+$-type source area 4 is configured to have an n-type impurity concentration of approximately in a range from $2.5 \times 10^{18}/cm^3$ to $1.0 \times 10^{19}/cm^3$, and a thickness of approximately 0.5 µm, for example. Each of the p-type deep layer 5 and the $p^+$-type contact layer 6, each having an impurity concentration higher than the impurity concentration of the base area 3, has a p-type impurity concentration in a range from $1.0 \times 10^{17}/cm^3$ to $1.0 \times 10^{19}/cm^3$, for example. According to the present embodiment, the $p^+$-type contact layer 6 reaches the base area 3, while the p-type deep layer 5 contacts the base area 3. Accordingly, the base area 3, the p-type deep layer 5, and the $p^+$-type contact layer 6 have a uniform potential.

An $n^+$-type limiting layer 7 is further formed on each inner side face of the deep trench 15, i.e., each side face of the p-type deep layer 5. The limiting layers 7 each reach a position shallower than (above) a bottom of the p-type deep layer 5. Accordingly, the p-type deep layer 5 has a portion that is deeper than the limiting layers 7 and is not provided with the limiting layers 7. The limiting layers 7 each have a predetermined thickness in a planar direction of the $n^+$-type substrate 1, and are respectively provided on one and the other side faces of the p-type deep layer 5 in such positions as to face each other and in such shapes as to have the same width. The limiting layers 7 are each configured to have an impurity concentration higher than the impurity concentration of the $n^-$-type drift layer 2, such as an impurity concentration in a range from $4.0 \times 10^6/cm^3$ to $1.0 \times 10^{17}/cm^3$.

A gate trench 8 that has a longitudinal direction coinciding with a vertical direction of the figure penetrates the base area 3 and the $n^+$-type source area 4, and reaches the $n^-$-type drift layer 2. The base area 3 and the $n^+$-type source area 4 described above are disposed in contact with a side face of the gate trench 8.

A portion included in the base area 3 and located on the side face of the gate trench 8 constitutes a channel area that connects the $n^+$-type source area 4 and the $n^-$-type drift layer 2 during operation of the vertical MOSFET. A gate insulation film 9 is formed on an inner wall surface of the gate trench 8 including the channel area. A gate electrode 10 containing doped Poly-Si is formed on a front face of the gate insulation film 9. The inside of the gate trench 8 is filled with the gate insulation film 9 and the gate electrode 10.

The trench gate structure is configured as described above. The trench gate structure extends in a longitudinal direction coinciding with the vertical direction of FIG. 1. A plurality of the trench gate structures are arranged in the left-right direction of FIG. 1 to constitute a stripe form. The $n^+$-type source area 4, the p-type deep layer 5, and the $p^+$-type contact layer 6 described above constitute a layout structure extending in the longitudinal direction of the trench gate structure.

A source electrode 11 and gate wiring (not shown) are further formed on front faces of the $n^+$-type source area 4 and the $p^+$-type contact layer 6, and the front face of the gate electrode 10. Each of the source electrode 11 and the gate wiring contains a plurality of types of metal, such as Ni/Al. The plurality of types of metal at least in a part being in contact with n-type SiC, more specifically, in contact with the $n^+$-type source area 4 contain metal capable of achieving ohmic contact with n-type SiC. The plurality of types of metal at least in a part being in contact with p-type SiC, more specifically, in contact with the $p^+$-type contact layer 6 is constituted by metal capable of achieving ohmic contact with p-type SiC. Each of the source electrode 11 and the gate wiring is provided on an interlayer insulation film (not shown) for electrically isolation. Electric contacts between the source electrode 11 and each of the $n^+$-type source area 4 and the $p^+$-type contact layer 6, and between the gate wiring and the gate electrode 10 are achieved via contact holes formed in the interlayer insulation films.

A drain electrode 12 electrically connected to the $n^+$-type substrate 1 is further formed on a rear face side of the $n^+$-type substrate 1. The vertical MOSFET having the n-channel type and inverted type trench gate structure is constructed as above. An outer peripheral resistant structure (not shown) is disposed in the outer peripheral area of the cell area containing the vertical MOSFET to constitute the SIC semiconductor device of the present embodiment.

According to the vertical MOSFET included in the SiC semiconductor device and having the inverted type trench gate structure configured as above, a channel area is formed in a front face of a portion included in the base area 3 and coming into contact with the gate trench 8 when a gate voltage is applied to the gate electrode 10. In this case, such an action is caused that allows electrons injected from the source electrode 11 to pass through the $n^+$-type source area 4 and the channel area formed in the base area 3, and reach the $n^-$-type drift layer 2, thereby producing a current flow between the source electrode 11 and the drain electrode 12.

A method for manufacturing the SiC semiconductor device configured as illustrated in FIG. 1 according to the present embodiment is now described with reference to FIGS. 2A to 4.

Figure 2A:
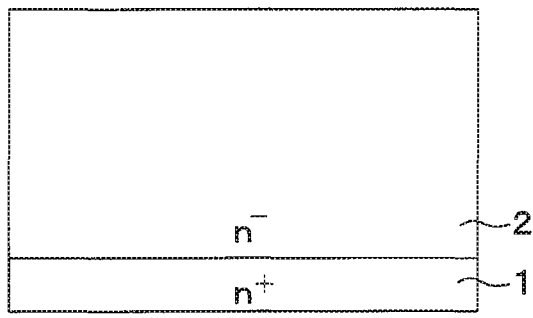
FIGS. 2A to 2E are cross-sectional views each illustrating a manufacturing step of the SiC semiconductor device shown in FIG. 1.

[Step Shown in FIG. 2A]

A semiconductor substrate is initially provided. This semiconductor substrate is an epitaxial substrate that includes the $n^+$-type substrate 1 containing SiC, and the $n^-$-type drift layer 2 containing SiC and formed by epitaxial growth on the front face of the $n^+$-type substrate 1.

Figure 2D:
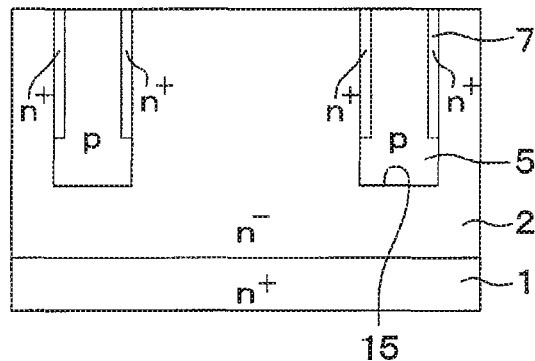
Figure 2B:
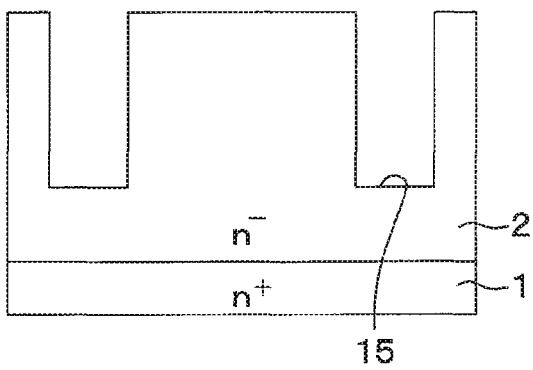

[Step Shown in FIG. 2B]

A mask member (not shown) is disposed on the front face of the $n^-$-type drift layer 2. Subsequently, predetermined positions for forming the p-type deep layer 5 and the limiting layers 7 are opened in the mask member by photolithography. In the state that the mask member is disposed, anisotropic etching such as reactive ion etching (RIE) is performed to form the deep trench 15 at the predetermined positions for forming the p-type deep layer 5 and the limiting layers 7. The $n^+$-type substrate 1 has the front face constituted by (0001) Si face, while the $n^-$-type drift layer 2 formed on the $n^+$-type substrate 1 has the same plane orientation. Accordingly, the deep trench 15 formed in this step has a bottom face constituted by (0001) Si face, and a side face constituted by a face or m face, such as (1-100) face.

Figure 2E:
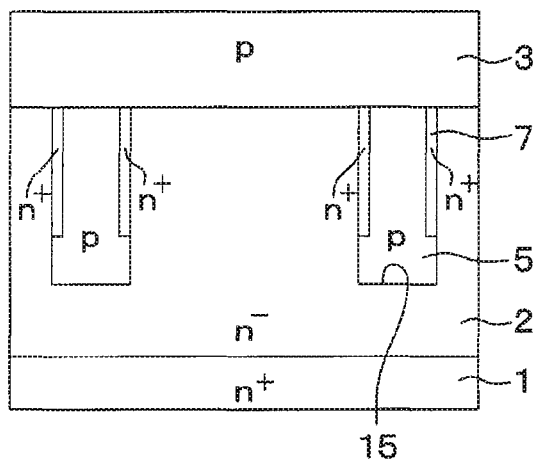
Figure 2C:
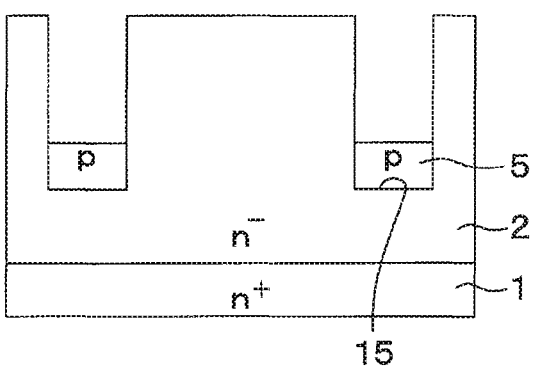

[Steps Shown in FIGS. 2C and 2D]

Figure 4:
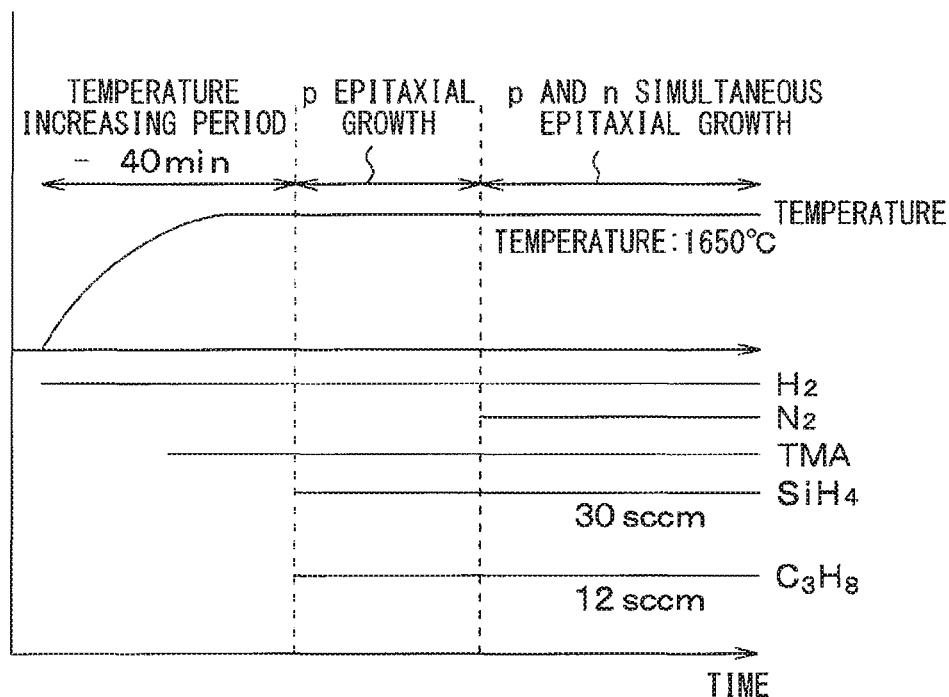
FIG. 4 is a time chart showing a growth program of a p-type deep layer and a limiting layer into a deep trench according to the first embodiment.

The mask member is removed. Epitaxial growth of an SiC layer is achieved by using an epitaxial growth device to fill the inside of the deep trench 15 with the SiC layer. More specifically, as shown in FIG. 4, a p-type dopant gas containing an organic metal material constituting p-type dopant is initially introduced together with an SIC material gas after an elapse of a temperature increasing period for increasing a temperature inside the epitaxial growth device to a predetermined temperature, such as 1650° C. For example, the temperature increasing period is set to 40 minutes or shorter. The temperature is increased to the predetermined temperature within the set period.

For example, silane constituting an Si material, and propane constituting a C material are employed as the SiC material gas. The p-type dopant gas employed for forming the p-type deep layer 5 is TMA (the abbreviation of trimethylaluminum) containing p-type dopant. For example, hydrogen ($H_2$) as an etching gas is further introduced as necessary.

Before a start of epitaxial growth, i.e., before introduction of the material gas, pre-doping for introducing the p-type dopant gas is performed in this step, thereafter the SiC material gas containing propane and silane is introduced into a chamber to cause epitaxial growth of the p-type deep layer 5. After an elapse of a predetermined time from introduction of the SIC material gas, an n-type dopant gas containing n-type dopant, such as nitrogen ($N_2$), is further introduced.

This pre-doping performed before epitaxial growth produces an atmosphere filled with the p-type dopant gas inside the chamber of the epitaxial growth device, and achieves absorption, or fixation, of the p-type dopant to an inner wall surface of the chamber.

In this case, fixation of the p-type dopant to the inner wall surface of the chamber is avoidable during an initial gas introduction stage of the growth of the p-type deep layer 5, wherefore the p-type dopant concentration in the atmosphere inside the chamber does not decrease. Accordingly, the p-type dopant concentration in the atmosphere inside the chamber is maintained at a desired concentration from the initial stage of epitaxial growth. In this condition, accurate control of the impurity concentration of the deep layer, such as a sharp change of the impurity concentration of the deep layer, is achievable.

Moreover, formation of a part of the p-type deep layer 5 at the inner bottom of the deep trench 15 is achievable by introduction of the SiC material gas together with introduction of the p-type dopant gas in this manner. Growth of a p-type SiC layer is easy to achieve on the bottom face of the deep trench 15, but is difficult to achieve on the side face of the deep trench 15 due to dependency of SiC on the plane orientation. Accordingly, conditions such as a temperature inside the chamber and an introduction amount of the SiC material gas are controlled such that a rate of formation of the p-type SiC layer on the side face of the deep trench 15 is balanced with a rate of removal of the p-type SiC layer by etching gas or by thermal etching. As a result, such a control is achievable that the p-type deep layer 5 is formed only on the inner bottom face of the deep trench 15, and not on the side face of the deep trench 15.

After formation of the p-type deep layer 5 on the bottom face of the deep trench 15, introduction of an n-type dopant gas is initiated. With the start of this introduction, etching gas is simultaneously introduced into the epitaxial growth device as necessary along with introduction of the p-type dopant gas, the n-type dopant gas, and the SiC material gas. Growth of an n-type SiC layer is easy to achieve on the side face of the deep trench 15, but is difficult to achieve on the bottom face of the deep trench 15 due to dependency of SiC on plane orientation. Accordingly, a p-type SiC layer is formed on the bottom face of the deep trench 15, while an n-type SiC layer is formed on the side face of the deep trench 15. As a result, the inside of the deep trench 15 comes into a state filled with the p-type deep layer 5 and the limiting layers 7 as illustrated in FIG. 2D. This step thereby produces such a structure that includes the p-type deep layer 5 extending from the bottom of the deep trench 15 toward an opening inlet, and the limiting layers 7 formed on the side faces of the deep trench 15, i.e., on the side faces of the p-type deep layer 5.

A p-type SiC layer that constitutes the p-type deep layer 5 is further formed on the front face of the $n^-$-type drift layer 2, which is not shown. Accordingly, the p-type SiC layer on the front face of the $n^-$-type drift layer 2 is removed by planarization such as grinding and chemical mechanical polishing (CMP) to expose the $n^-$-type drift layer 2.

[Step Shown in FIG. 2E]

Epitaxial growth of the base area 3 is achieved on the front face of the $n^-$-type drift layer 2 and on the p-type deep layer 5 and the limiting layers 7 again by using the epitaxial growth device. This epitaxial growth is performed in a manner substantially similar to the step shown in FIG. 2B, i.e., is achieved by introduction of an SiC material gas after the temperature inside the epitaxial growth device is adjusted to a predetermined temperature. Thereafter, the p-type impurity concentration of the base area 3 is adjusted to a desired concentration by controlling an introduction amount of the dopant gas.

According to the example described herein, the step shown in FIG. 2E is performed separately from the step shown in FIG. 2D. However, these steps may be simultaneously performed. However, the impurity concentration of the base area 3, which constitutes a channel area, needs to be adjusted to a desired concentration. Accordingly, it is preferable to form the portion of the p-type deep layer 5 located at the bottom of the deep trench 15, and thereafter control the introduction amount of the dopant gas containing the p-type dopant to adjust the impurity concentration of the base area 3 to a desired concentration.

Figure 3A:
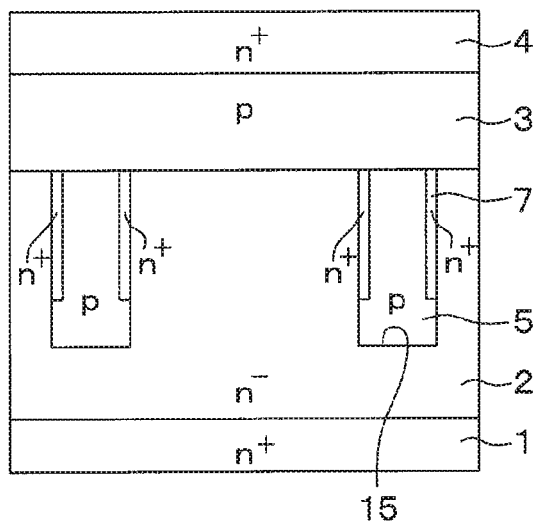
FIGS. 3A to 3D are cross-sectional views each illustrating a manufacturing step of the SiC semiconductor device, continuing from FIG. 2E.

[Step Shown in FIG. 3A]

A step for forming the $n^+$-type source area 4 on the front face of the base area 3 is performed. More specifically, after completion of the step shown in FIG. 2E, the dopant gas introduced into the epitaxial growth device is changed to a dopant gas containing n-type dopant (e.g., nitrogen) to form the $n^+$-type source area 4.

Figure 3C:
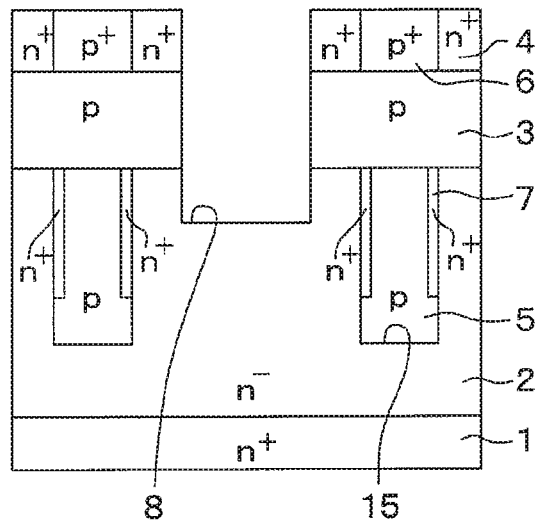
Figure 3B:
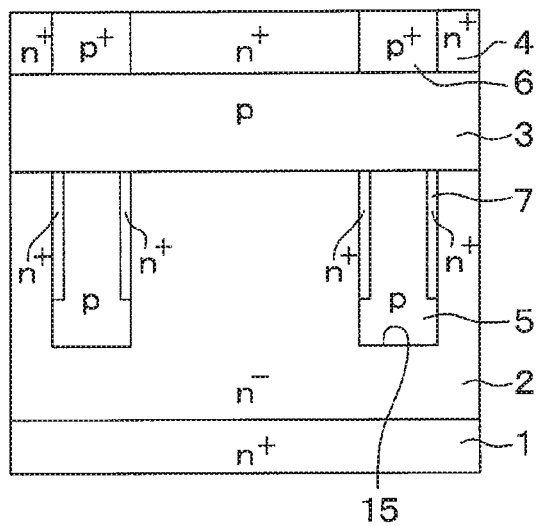

[Step Shown in FIG. 3B]

A step for forming the $p^+$-type contact layer 6 is performed by ion implantation or epitaxial growth.

When ion implantation is adopted in this step, a mask member (not shown) is disposed on the front face of the $n^+$-type source area 4. Subsequently, a predetermined position for forming the $p^+$-type contact layer 6 is opened in the mask member by photolithography. In the state that the mask member is disposed, p-type dopant, such as aluminum, is ion-implanted to form the $p^+$-type contact layer 6.

When epitaxial growth is adopted in this step, a mask member is initially disposed with an opening in a predetermined area for forming the $p^+$-type contact layer 6 similarly to the ion implantation. In the state that the mask member is disposed, anisotropic etching such as RIE is performed to form a trench at the predetermined position for forming the $p^+$-type contact layer 6. Thereafter, the mask member is removed, and a $p^+$-type layer is formed throughout the front face of the $n^+$-type source area 4 including the inside of the trench by again using the epitaxial growth device. A SiC material gas and a dopant gas employed in this step are similar to those gases employed in the step for forming the base area 3. The gas introduction amount is controlled in accordance with the impurity concentration of the $p^+$-type contact layer 6. Thereafter, the front face of the $n^+$-type source area 4 is exposed by planarization such as grinding and CMP. In this manner, the $p^+$-type layer remaining only inside the trench becomes the $p^+$-type contact layer 6.

[Step Shown in FIG. 3C]

A mask member (not shown) is disposed on the front faces of the $n^+$-type source area 4 and the $p^+$-type contact layer 6. Subsequently, a predetermined position for forming the gate trench 8 is opened in the mask member by photolithography. In the state that the mask member is disposed, anisotropic etching such as RIE is performed to form the gate trench 8 in the cell area. Thereafter, the mask member is removed.

Hydrogen etching is carried out as necessary by heating in a hydrogen atmosphere at 1600° C. or higher and under depressurization, such as a high-temperature hydrogen atmosphere at 1625° C. and $2.7 \times 10^4$ Pa (=200 Torr). This hydrogen etching achieves rounding of the inner wall surface of the gate trench 8, i.e., rounding an opening inlet or a corner portion of the gate trench 8, and removing damage caused by trench etching.

Figure 3D:
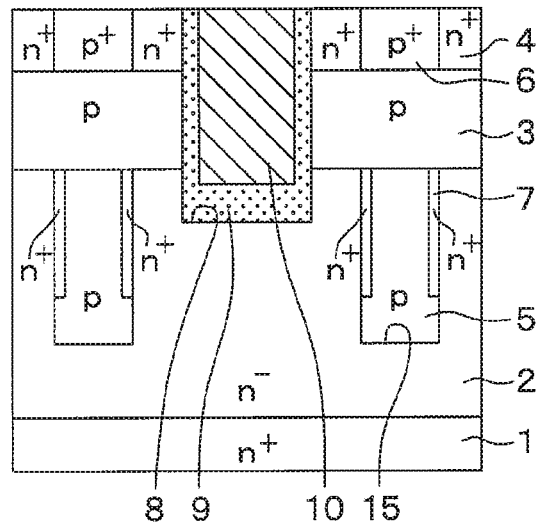

[Step Shown in FIG. 3D]

The gate insulation film 9 is formed by thermal oxidation in a wet atmosphere. Thereafter, a doped Poly-Si layer is formed on the front face of the gate insulation film 9, and patterned such that the doped Poly-Si layer remains inside the gate trench 8 and constitutes the gate electrode 10. Steps after this step are similar to steps conventionally performed. More specifically, a step for forming interlayer insulation films, a step for forming contact holes by photo-etching, a step for forming the source electrode 11 and the gate wiring layer by patterning after deposition of electrode material, a step for forming the drain electrode 12 on the rear face of the $n^+$-type substrate 1, and other steps are performed. As a result, the SiC semiconductor device that includes the vertical MOSFET having the trench gate structure in FIG. 1 and disposed in the cell area is completed.

According to the present embodiment described above, a dopant gas containing p-type dopant, and a dopant gas containing n-type dopant are both introduced to simultaneously form the p-type deep layer 5 and the limiting layers 7. More specifically, by utilizing plane orientation dependency of each of the p-type SiC layer and the n-type SiC layer during epitaxial growth, the p-type deep layer 5 is formed on the bottom of the deep trench 15, while the limiting layers 7 are formed on the side faces of the deep trench 15. In this manner, accurate formation of the vertical MOSFET that has the structure including the limiting layers 7 on the side faces of the p-type deep layer 5 as illustrated in FIG. 1 is achievable.

Moreover, the p-type deep layer 5 and the limiting layers 7 are simultaneously formed in the present embodiment. Accordingly, the manufacturing steps are more simplified than those of a case that separately forms the p-type deep layer 5 and the limiting layers 7.

(Second Embodiment)

A second embodiment is now described. The present embodiment is similar to the first embodiment except for the configuration of the base area 3 that has been changed from the corresponding configuration of the first embodiment. Accordingly, only parts different from the corresponding parts of the first embodiment are herein described.

According to the first embodiment described above, the base area 3 has a uniform impurity concentration. However, not all parts of the base area 3 are required to have a uniform impurity concentration. The base area 3 described in the present embodiment has a laminated structure constituted by parts having different impurity concentrations.

Figure 5:
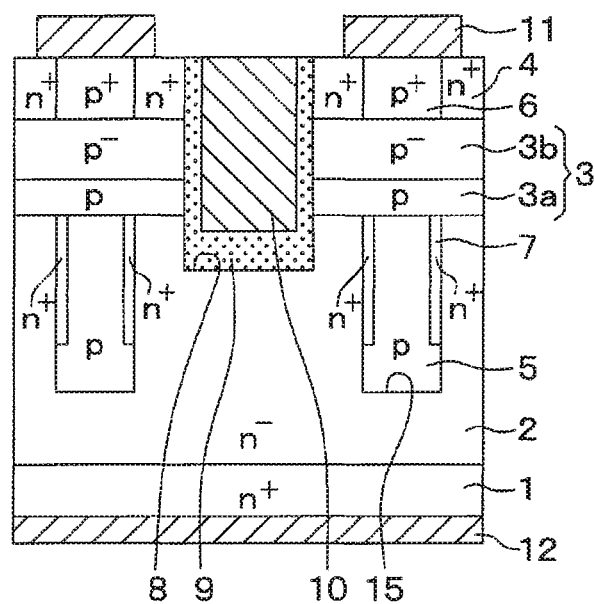
FIG. 5 is a cross-sectional view of an SiC semiconductor device including a vertical MOSFET according to a second embodiment.

As illustrated in FIG. 5, the base area 3 includes a high-concentration base area 3a on the n$^-$-type drift layer 2 side, and a low-concentration base area 3b disposed above the high-concentration base area 3a and having an impurity concentration lower than the impurity concentration of the high-concentration base area 3a. The base area 3 is therefore configured to have a structure having varied impurity concentrations. Following advantageous effects are offered by an SiC semiconductor device having this structure.

The high-concentration base area 3a provided therein reduces expansion of a depletion layer inside the base area 3. In this case, full depletion inside the base area 3 and punch-through caused thereby are avoidable. Accordingly, a sufficient element breakdown voltage is securable, while deterioration of the gate insulation film 9 at the bottom of the gate trench 8 is avoidable. Moreover, a threshold voltage becomes dependent on the p-type impurity concentration of the high-concentration base area 3a. Accordingly, a threshold voltage is allowed to increase.

The base area 3 includes not only the high-concentration base area 3a, but also the low-concentration base area 3b. In this case, channel mobility is allowed to increase in the low-concentration base area 3b. Accordingly, even in the presence of the high-concentration base area 3a, reduction of on-resistance is achievable. The vertical MOSFET having the trench gate structure provided therein is therefore capable of reducing on-resistance, securing a sufficient element breakdown voltage, and increasing a threshold voltage.

The high-concentration base area 3a provided therein improves the pull-out effect of carriers produced by junction between the n$^-$-type drift layer 2 and the base area 3 in an off-state. In this case, a drain leak current decreases. More specifically, the pull-out effect of the carriers at the junction portion of the base area 3 being in contact with the n$^-$-type drift layer 2 more improves as the p-type impurity concentration at the junction portion increases. According to the present embodiment, this junction portion corresponds to the high-concentration base area 3a. In this case, the pull-out effect of the carriers produced by junction between the n$^-$-type drift layer 2 and the base area 3 improves more than a configuration that constitutes the base area 3 only by the low-concentration base area 3b. The high-concentration base area 3a is formed throughout the lower layer part of the base area 3. In this case, a state of contact between the base area 3 and the n$^-$-type drift layer 2 extends in a wider range, and connects to the p$^+$-type SiC layer. Accordingly, drawing-out is achievable via the p$^+$-type SiC layer. As a result, the pull-out effect of the carriers further improves.

The contact portion of the base area 3 being in contact with the n$^-$-type drift layer 2 is constituted only by the high-concentration base area 3a having a high p-type impurity concentration. In this case, reduction of an initial voltage is achievable for a current flow in a built-in diode constituted by PN junction between the n$^-$-type drift layer 2 and the base area 3. The reduction of the initial voltage thus achieved reduces on-voltage of the built-in diode, thereby reducing losses produced during synchronous rectification driving that positively uses the built-in diode.

Moreover, an equipotential line does not easily enter below the trench gate structure in the off-state by the presence of a depletion layer extending from the high-concentration base area 3a toward the n$^-$-type drift layer 2. In this case, an electric field applied to the gate insulation film 9 does not intensively concentrate on the bottom face of the gate trench 8. Accordingly, the life and reverse bias life of the gate insulation film 9 increase.

For manufacturing the SiC semiconductor device that includes the base area 3 having varied impurity concentrations as in this example, a method similar to the method of the first embodiment is adoptable except for the point that the introduction amount of a dopant gas containing p-type dopant during a forming step of the base area 3 is changed in accordance with the impurity concentrations of the base area 3.

(Third Embodiment)

A third embodiment is now described. The present embodiment is similar to the first and second embodiments except for the configuration of the vertical MOSFET that has been changed from the corresponding configurations of the first and second embodiments. Accordingly, only parts different from the corresponding parts of the first and second embodiments are herein described. According to the structure adopted in the present embodiment described herein, the impurity concentration of the base area 3 is varied similarly to the second embodiment. Needless to say, this structure is applicable to the first embodiment.

Figure 6:
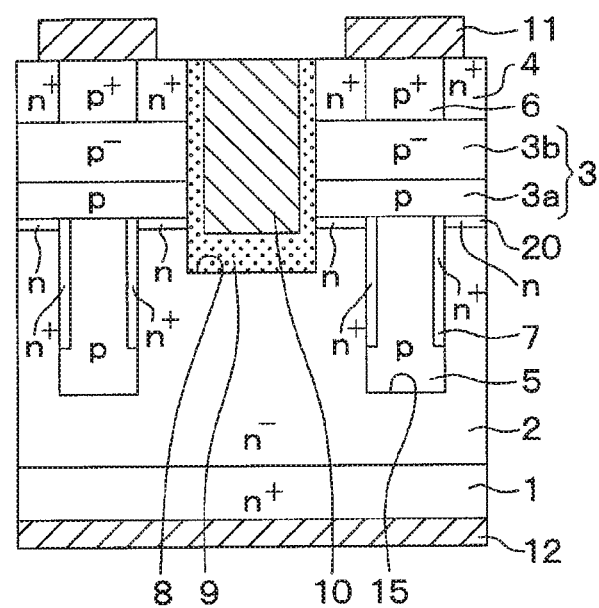
FIG. 6 is a cross-sectional view of an SiC semiconductor device including a vertical MOSFET according to a third embodiment.

According to the first and second embodiments described above, the base area 3 is directly formed on the n$^-$-type drift layer 2. However, an n-type layer 20 having an impurity concentration higher than the impurity concentration of the n$^-$-type drift layer 2 may be provided on the n$^-$-type drift layer 2 as illustrated in FIG. 6.

The n-type layer 20 thus provided can function as a current diffusion layer that allows electrons having passed through a channel area to expand in a substrate plane direction within the n-type layer 20, and then flow toward the drain electrode 12. Accordingly, a current path is allowed to expand, wherefore further reduction of on-resistance is achievable.

Figure 7A:
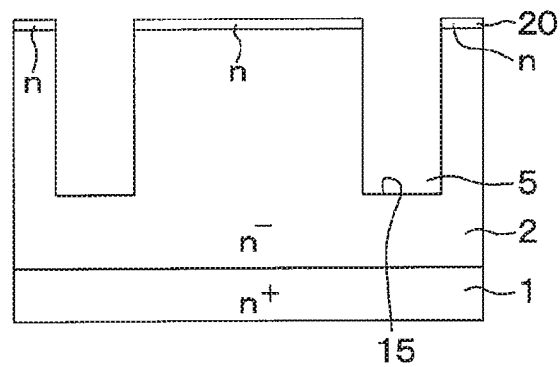
FIGS. 7A to 7C are cross-sectional views each illustrating a manufacturing step of the SiC semiconductor device shown in FIG. 6.
Figure 7B:
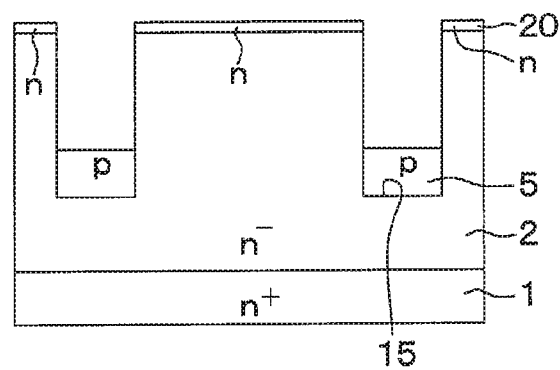
Figure 7C:
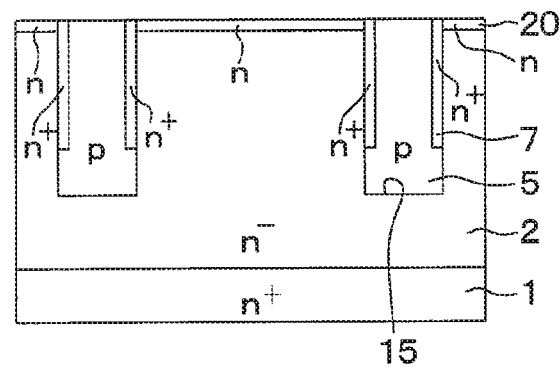

According to this configuration, the n-type layer 20 is formed on the n$^-$-type drift layer 2 before formation of the p-type deep layer 5 and the limiting layers 7 as illustrated in FIG. 7A, for example. More specifically, a mask member is disposed with openings in predetermined areas for forming the p-type deep layer 5 and the limiting layer 7. The deep trench 15 penetrating both the n$^-$-type drift layer 2 and the n-type layer 20 is formed in this condition. Thereafter, steps similar to the above-described steps shown in FIGS. 2C and 2D are performed to form the p-type deep layer 5 and the limiting layers 7 as illustrated in FIGS. 7B and 7C.

(Fourth Embodiment)

A fourth embodiment is now described. The present embodiment is similar to the first to third embodiments except for the manufacturing process of the p-type deep layer 5 and the limiting layers 7, which has changed from the corresponding process of the first to third embodiments. Accordingly, only parts different from the corresponding parts of the first to third embodiments are herein described. According to the structure adopted in the present embodiment described herein, the n-type layer 20 is provided similarly to the third embodiment. Needless to say, this structure is applicable to the first and second embodiments.

Figure 8A:
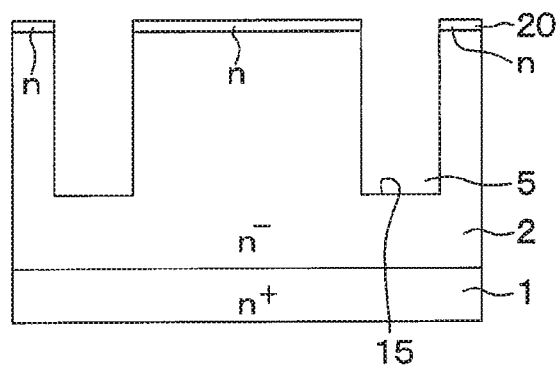
FIGS. 8A to 8D are cross-sectional views each illustrating a manufacturing step of an SiC semiconductor device described in a fourth embodiment.
Figure 8B:
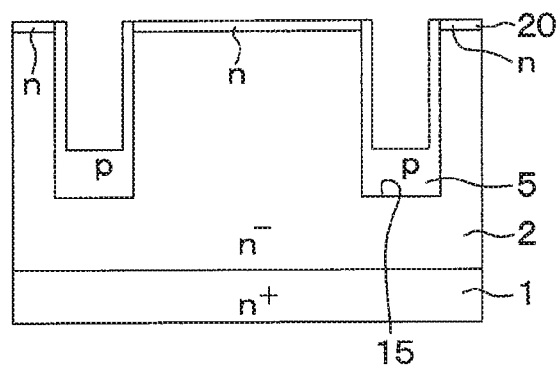
Figure 8C:
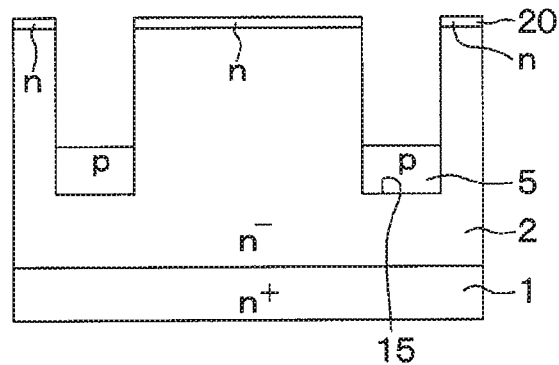

Initially, the n-type layer 20 is formed on the n⁻-type drift layer 2 as illustrated in FIG. 8A. Thereafter, a mask member is disposed with openings in predetermined areas for forming the p-type deep layer 5 and the limiting layers 7. The deep trench 15 penetrating both the n⁻-type drift layer 2 and the n-type layer 20 is formed in this condition. Subsequently, a part of the p-type deep layer 5 is formed on the inner wall surface of the deep trench 15 as illustrated in FIG. 8B. In this case, a part of the p-type deep layer 5 is preferably formed only on the bottom of the deep trench 15. However, a p-type SIC layer constituting the p-type deep layer 5 may also be formed on the side face of the deep trench 15 depending on growth conditions. Accordingly, a step for removing the part of the p-type deep layer 5 formed on the side face of the deep trench 15 is performed as illustrated in FIG. 8C.

Figure 9:
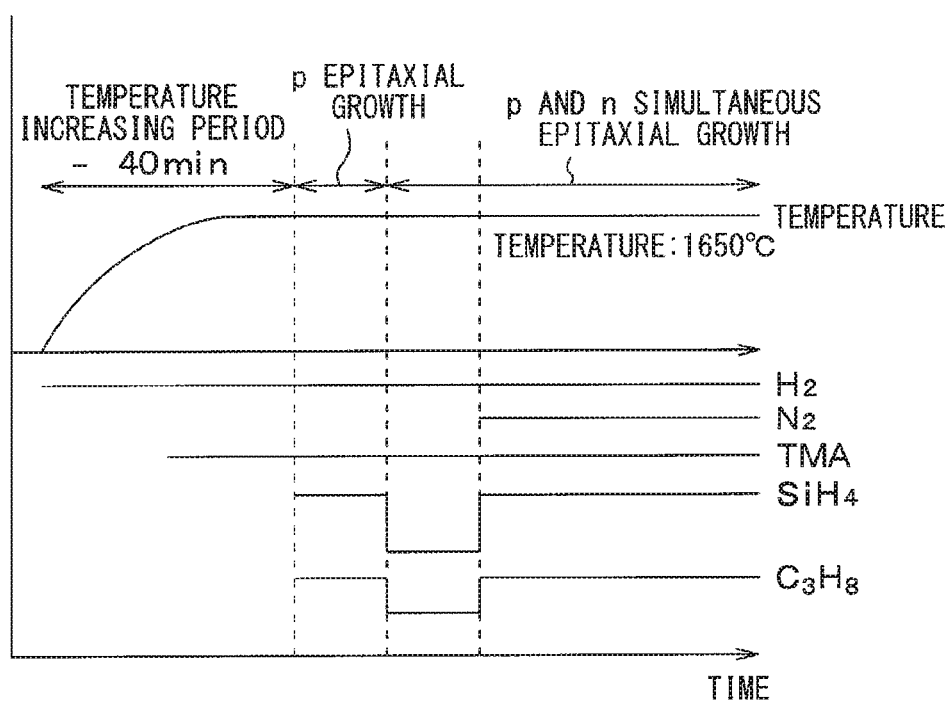
FIG. 9 is a time chart showing a growth program of a p-type deep layer and a limiting layer into a deep trench according to the fourth embodiment.

For example, as shown in FIG. 9, the temperature of the epitaxial growth device is increased to a predetermined temperature, such as 1650° C., after an elapse of a temperature increasing period. In addition, pre-doping of p-type dopant, and also introduction of etching gas, if necessary, are performed. Furthermore, an SiC material gas is introduced to form a part of the p-type deep layer 5 on the inner wall surface of the deep trench 15, whereafter the introduction amount of the SiC material gas is decreased for a fixed period to remove a p-type SiC layer formed on the side wall of the deep trench 15. In this case, the p-type SiC layer is difficult to remove from the bottom face of the deep trench 15, but is easy to remove from the side face of the deep trench 15 due to dependency of SiC on plane orientation. Accordingly, only the p-type SiC layer on the side face of the deep trench 15 is removed, while a part of the p-type deep layer 5 is left on the bottom of the deep trench 15 without removal.

Figure 8D:
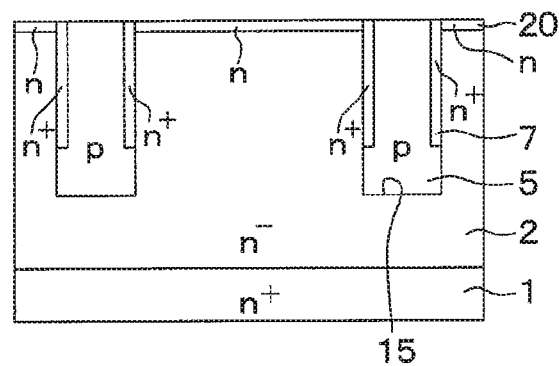

Thereafter, as shown in FIG. 9, the introduction amount of the SiC material gas is returned to the introduction amount during epitaxial growth. In addition, a dopant gas containing n-type dopant is introduced. This step fills the inside of the deep trench 15 with the p-type deep layer 5 and the limiting layers 7 as illustrated in FIG. 8D, thereby producing such a structure that includes the limiting layers 7 respectively provided on the side faces of the p-type deep layer 5, with only the p-type deep layer 5 provided on the bottom of the deep trench 15. Thereafter, the respective steps illustrated in FIG. 2D and after this figure as described in the first embodiment are performed to manufacture an SiC semiconductor device that includes a vertical MOSFET structured similarly to the vertical MOSFETs of the first to third embodiments.

As described above, even when a p-type SiC layer is additionally formed on the side face of the deep trench 15 during formation of the portion of the p-type deep layer 5 located on the bottom of the deep trench 15, the portion of the p-type SiC layer on the side face of the deep trench 15 is removed to manufacture the SiC semiconductor device structured similarly to the first to third embodiments.

(Fifth Embodiment)

A fifth embodiment is now described. The present embodiment is similar to the first to third embodiments except for the manufacturing process of the p-type deep layer 5 and the limiting layers 7, which has been changed from the corresponding process of the first to third embodiments. Accordingly, only parts different from the corresponding parts of the first to third embodiments are herein described. According to the structure adopted in the present embodiment described herein, the n-type layer 20 is provided similarly to the third embodiment. Needless to say, this structure is applicable to the first and second embodiments.

Figure 10A:
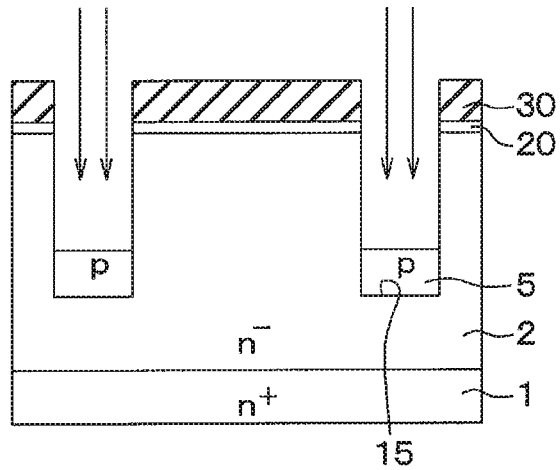
FIGS. 10A to 10C are cross-sectional views each illustrating a manufacturing step of an SiC semiconductor device described in a fifth embodiment.
Figure 10B:
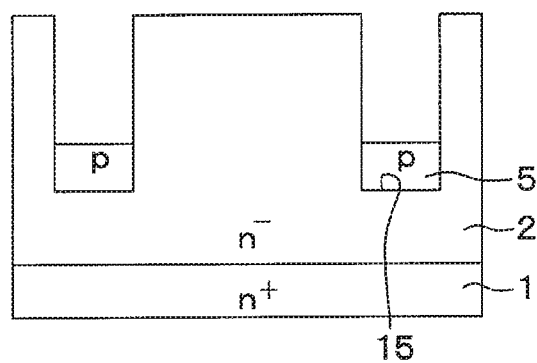

Initially, the n-type layer 20 is formed on the n⁻-type drift layer 2 as illustrated in FIG. 10A. Thereafter, a mask member 30 is disposed with openings in predetermined areas for forming the p-type deep layer 5 and the limiting layers 7. The deep trench 15 penetrating both the n⁻-type drift layer 2 and the n-type layer 20 is formed in this condition. Subsequently, p-type dopant, such as aluminum, is ion-implanted in a covered state by the mask member 30 to form a part of the p-type deep layer 5 on the bottom of the deep trench 15. Thereafter, the mask member 30 is removed as illustrated in FIG. 10B. After removal of the mask member 30, a step similar to the step shown in FIG. 2D is performed in a step illustrated in FIG. 10C.

Figure 11:
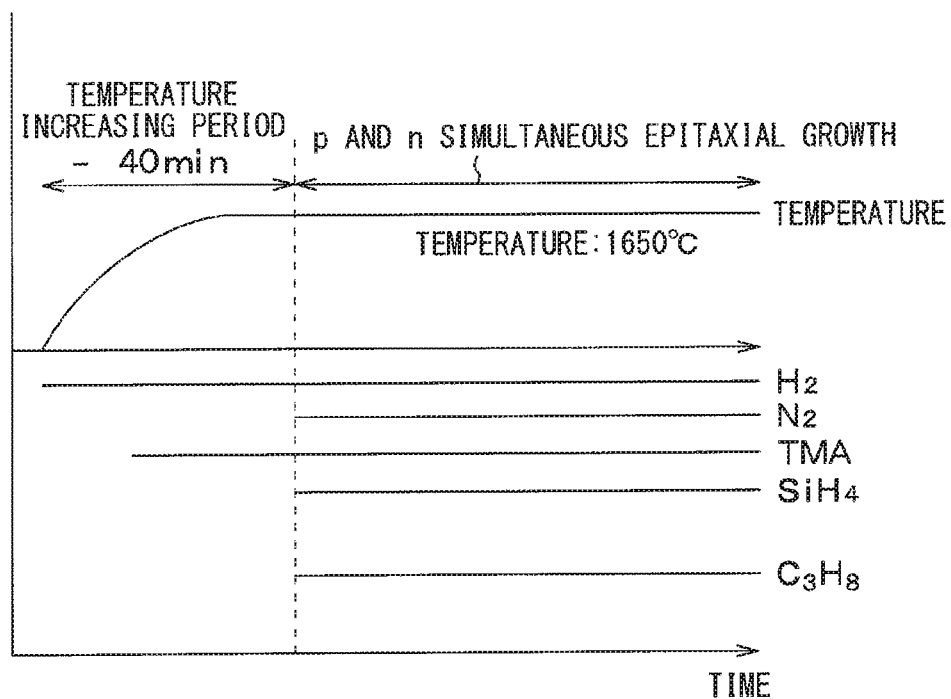
FIG. 11 is a time chart showing a growth program of a p-type deep layer and a limiting layer into a deep trench according to the fifth embodiment.

In this case, as shown in FIG. 11, for example, the temperature of the epitaxial growth device is increased to a predetermined temperature, such as 1650° C., during a temperature increasing period. In addition, an etching gas is introduced as necessary. According to the example described herein, pre-doping of p-type dopant is performed. However, pre-doping may be omitted for the p-type deep layer 5 at a part formed on the bottom of the deep trench 15, considering that this part has been already formed. However, pre-doping is preferably performed to adjust the impurity concentration of the p-type deep layer 5 to a desired concentration with excellent controllability from an initial stage of epitaxial growth.

Figure 10C:
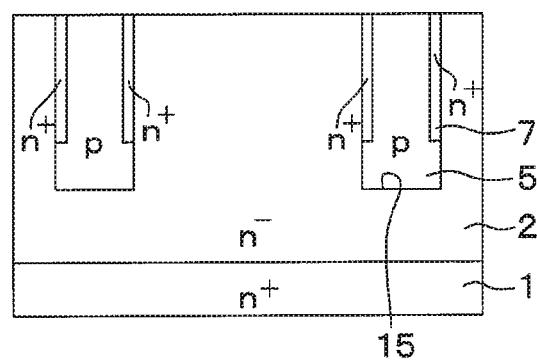

Thereafter, an SiC material gas and a dopant gas containing n-type dopant are both introduced. This introduction of the gases fills the inside of the deep trench 15 with the p-type deep layer 5 and the limiting layers 7 as illustrated in FIG. 10C, thereby producing such a structure that includes the limiting layers 7 respectively disposed on the side faces of the p-type deep layer 5, and the ion-implanted p-type deep layer 5 disposed on the bottom of the deep trench 15. Thereafter, the respective steps illustrated in FIG. 2D and after this figure as described in the first embodiment are performed to manufacture an SiC semiconductor device that includes a vertical MOSFET structured similarly to the vertical MOSFETs of the first to third embodiments.

As described above, the p-type deep layer 5 at the part located on the bottom of the deep trench 15 can be formed by ion implantation. Even by this method, an SiC semiconductor device structured similarly to the first to third embodiments can be produced.

(Sixth Embodiment)

A sixth embodiment is now described. According to the present embodiment, the impurity concentration of the base area 3 is varied similarly to the second embodiment, and a manufacturing process is so changed as to produce a structure including the n-type layer 20 similarly to the third embodiment. Other points are similar to the corresponding points of the second and third embodiments. Accordingly, only parts different from the corresponding parts of the second and third embodiments are herein described.

Figure 12:
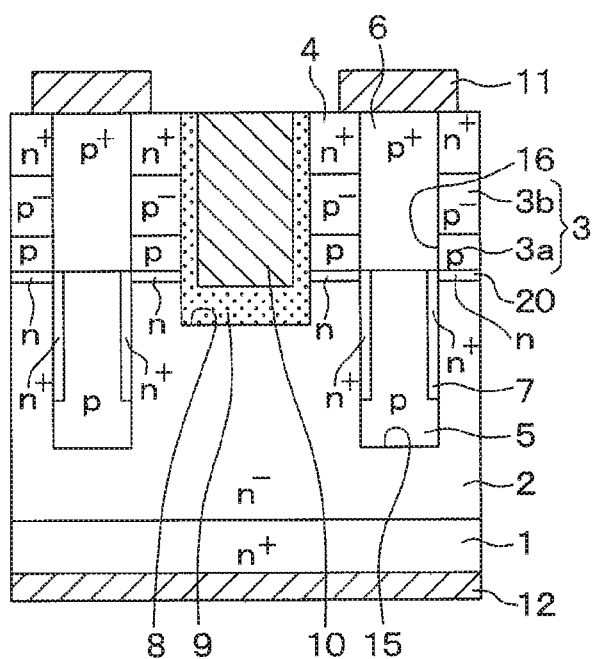
FIG. 12 is a cross-sectional view of an SiC semiconductor device including a vertical MOSFET according to a sixth embodiment.

FIG. 12 is a cross-sectional view of an SiC semiconductor device that includes a vertical MOSFET manufactured by a manufacturing method according to the present embodiment. As illustrated in the figure, a structure produced herein includes the n-type layer 20, and the high-concentration base area 3a and the low-concentration base area 3b that constitute the base area 3. The p+-type contact layer 6 reaches at least below the n+-type source area 4. According to this example, the p+-type contact layer 6 reaches a boundary position between the base area 3 and the n−-type drift layer 2. A method for manufacturing the SiC semiconductor configured as illustrated in FIG. 12 according to the present embodiment is hereinafter described with reference to FIGS. 13A to 14D.

Figure 13A:
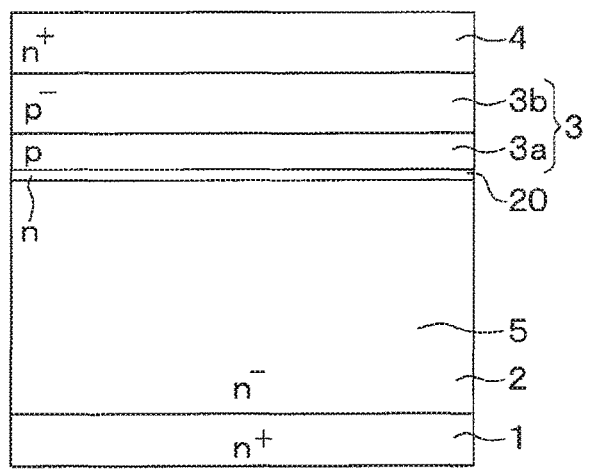
FIGS. 13A to 13D are cross-sectional views each illustrating a manufacturing step of the SC semiconductor device shown in FIG. 12.

[Step Shown in FIG. 13A]

A semiconductor substrate is initially provided. This semiconductor substrate is an epitaxial substrate that includes the n+-type substrate 1 containing SiC, and the n−-type drift layer 2 containing SiC and formed by epitaxial growth on the front face of the n+-type substrate 1. The epitaxial substrate is placed within the epitaxial growth device. Epitaxial growth of the n-type layer 20, the high-concentration base area 3a, the low-concentration base area 3b, and the n+-type source area 4 is sequentially achieved on the front face of the n−-type drift layer 2.

Figure 13C:
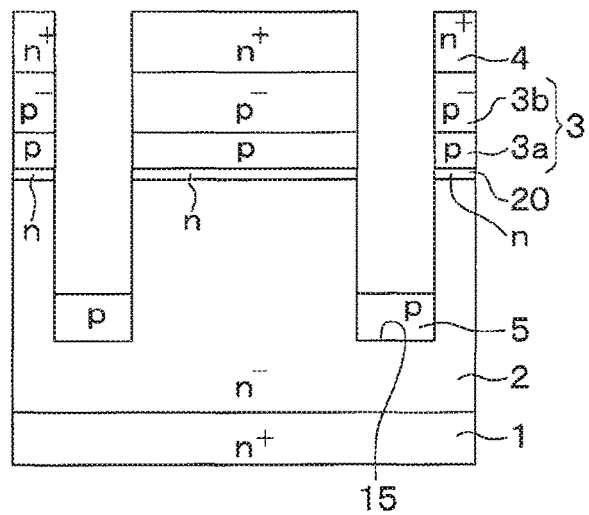
Figure 13B:
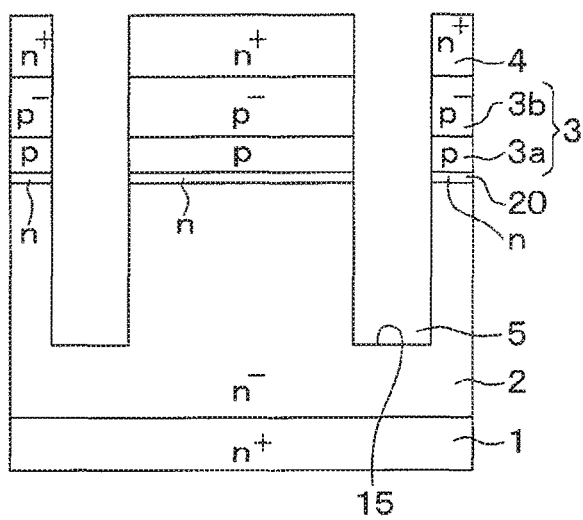

[Step Shown in FIG. 13B]

A mask member (not shown) is disposed on the front face of the n+-type source area 4. Subsequently, predetermined positions for forming the p-type deep layer 5, the limiting layers 7, and the p+-type contact layer 6 in the mask member are opened by photolithography. In the state that the mask member is disposed, anisotropic etching such as RIE is performed to form the deep trench 15 at the predetermined positions for forming the p-type deep layer 5, the limiting layers 7, and the p+-type contact layer 6.

Figure 13D:
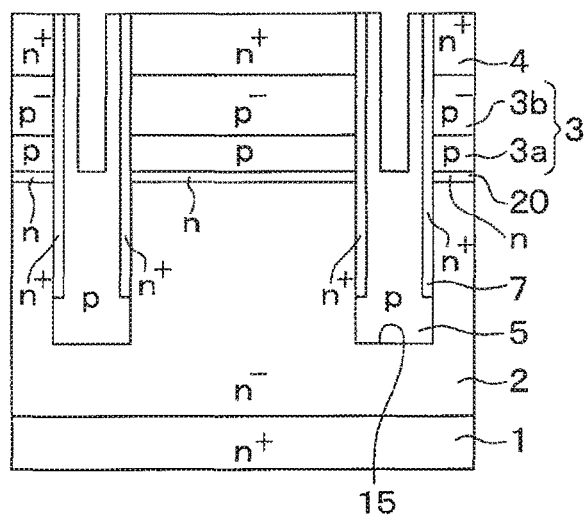

[Steps Shown in FIGS. 13C and 13D]

The mask member is removed. Epitaxial growth of an SiC layer is achieved by steps similar to the foregoing steps in FIGS. 2C and 2D, again using the epitaxial growth device to fill the inside of the deep trench 15 with the SiC layer. These steps fill the inside of the deep trench 15 with the p-type deep layer 5 and the limiting layers 7, thereby producing such a structure that includes the limiting layers 7 respectively provided on the side faces of the p-type deep layer 5, with only the p-type deep layer 5 provided on the bottom of the deep trench 15.

A p-type SiC layer that constitutes the p-type deep layer 5 is further formed on the front face of the n+-type source area 4, which is not shown. Accordingly, the p-type SiC layer on the front face of the n+-type source area 4 is removed by planarization such as grinding and CMP to expose the n+-type source area 4.

Figure 14A:
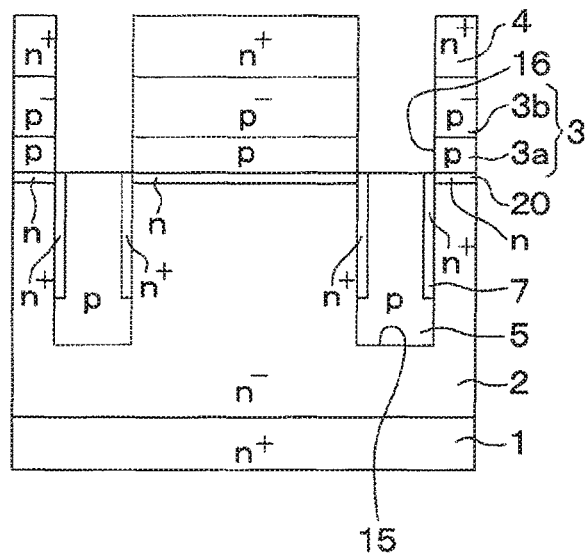
FIGS. 14A to 14D are cross-sectional views each illustrating a manufacturing step of the SiC semiconductor device, continuing from FIG. 13D.

[Step Shown in FIG. 14A]

Upper parts of the p-type deep layer 5 and the limiting layers 7 are partially removed to expose at least a part of the base area 3. For example, hydrogen etching is carried out by using the epitaxial growth device. Hydrogen etching selectively etches a trench side face. As a result, a state illustrated in FIG. 14A is produced.

Figure 14C:
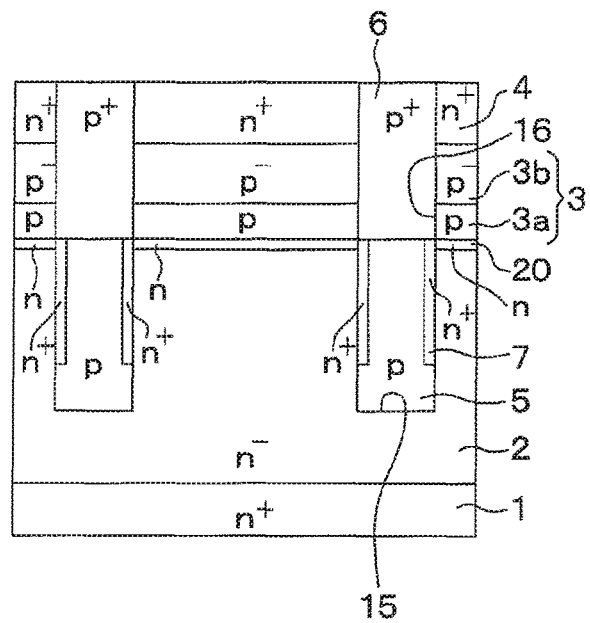
Figure 14B:
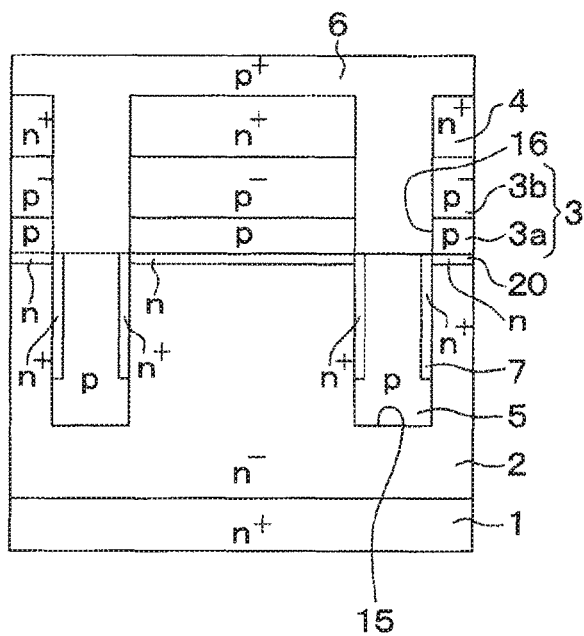

[Step Shown in FIG. 14B]

The p+-type contact layer 6 is formed by filling the inside of the trench 16 with a p+-type SiC layer again by using the epitaxial growth device.

[Step Shown in FIG. 14C]

The part of the p+-type SiC layer constituting the p+-type contact layer 6 and corresponding to a part located on the n+-type source area 4 is removed by grinding, CMP, or other methods to planarize the front face.

Figure 14D:
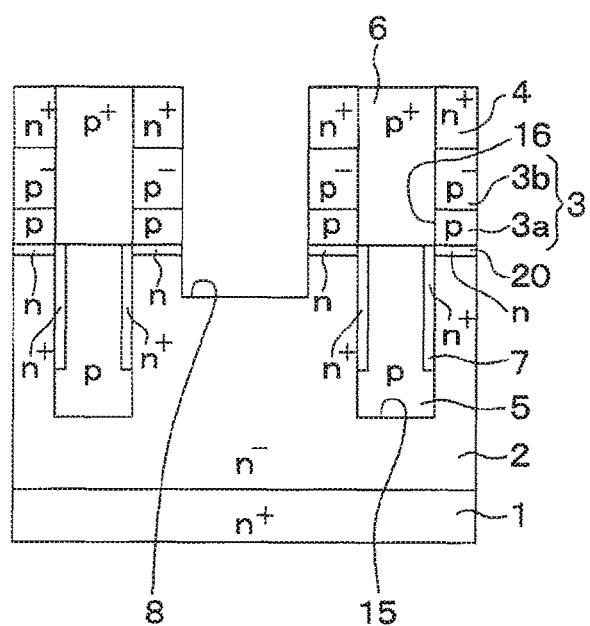

[Step Shown in FIG. 14D]

A mask member (not shown) is disposed on the front faces of the n+-type source area 4 and the p+-type contact layer 6. Subsequently, a predetermined position for forming the gate trench 8 is opened in the mask member by photolithography. In the state that the mask member is disposed, anisotropic etching such as RIE is performed to form the gate trench 8 in the cell area. Thereafter, the mask member is removed.

Thereafter, the respective steps illustrated in FIG. 2E and after this figure and described in the first embodiment are performed to manufacture the SIC semiconductor device that includes the vertical MOSFET illustrated in FIG. 12.

As described above, the p-type deep layer 5 and the limiting layers 7 may be formed after sequential epitaxial growth of the n-type layer 20, the high-concentration base area 3a, the low-concentration base area 3b, and the n+-type source area 4 on the front face of the n−-type drift layer 2. When the vertical MOSFET is formed in this order, the potential of the base area 3 is difficult to fix at the source potential at the time of cutoff of connection between the base area 3 and the p+-type contact layer 6 by the limiting layers 7. Accordingly, in the foregoing step illustrated in FIG. 14A, the p+-type contact layer 6 is formed after exposure of at least a part of the base area 3 so as to secure electric connection between the base area 3 and the p+-type contact layer 6, and thereby fix the potential of the base area 3 to the source potential.

(Seventh Embodiment)

A seventh embodiment is now described. According to the present embodiment, an SiC semiconductor device including a vertical JBS as a semiconductor element instead of a vertical MOSFET will be described.

Figure 15:
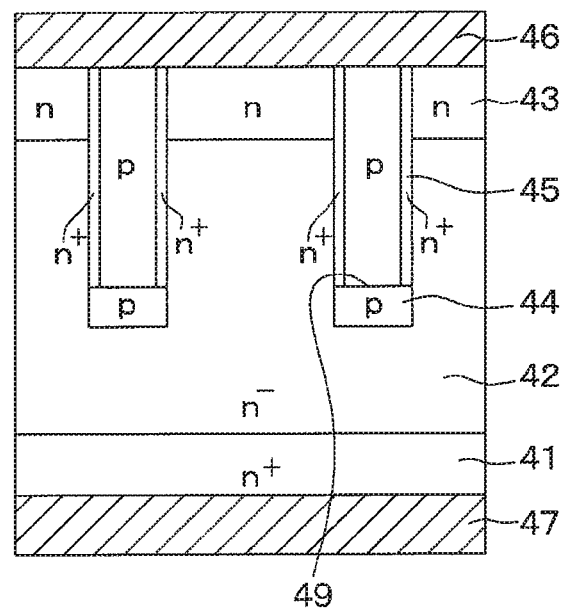
FIG. 15 is a cross-sectional view of an SiC semiconductor device including a JBS according to a seventh embodiment.

As illustrated in FIG. 15, the SiC semiconductor device according to the present embodiment similarly has a semiconductor substrate that includes an n+-type substrate 41 constituting a high-concentration impurity layer containing SiC, and an n−-type drift layer 42 disposed on a front face side of the n+-type substrate 41 and containing SiC having an impurity concentration lower than the impurity concentration of the n+-type substrate 41. The semiconductor substrate employed herein is similar to the semiconductor substrate of the first embodiment.

An n-type layer 43 having an impurity concentration higher than the impurity concentration of the n−-type drift layer 2 is formed on the n−-type drift layer 42. A deep layer 44 and limiting layers 45 are formed to penetrate the n-type layer 43 and to reach the n−-type drift layer 2. The limiting layers 45 are respectively formed on side faces of the deep layer 44, but not formed on a bottom of the deep layer 44.

A Schottky electrode 46 is further formed on and being in contact with the n-type layer 43, the deep layer 44, and the limiting layers 45. An ohmic electrode 47 corresponding to a back electrode is provided on a rear face side of the n+-type substrate 41, i.e., on a side opposite to the n−-type drift layer 42 to constitute the SC semiconductor device including the vertical JBS illustrated in FIG. 15.

A method for manufacturing the SiC semiconductor device configured as illustrated in FIG. 15 according to the present embodiment is now described with reference to FIGS. 16A to 16D.

Figure 16A:
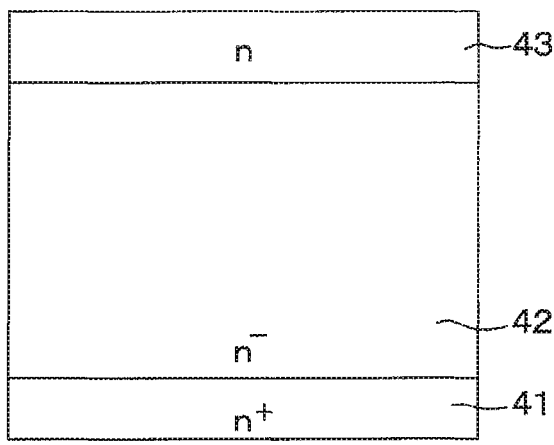
FIGS. 16A to 16D are cross-sectional views each illustrating a manufacturing step of the SiC semiconductor device shown in FIG. 15.

[Step Shown in FIG. 16A]

A semiconductor substrate is initially provided. This semiconductor substrate is an epitaxial substrate that includes the n+-type substrate 41 containing SiC, and the n−-type drift layer 42 containing SiC and formed by epitaxial growth on the front face of the n+-type substrate 41.

Figure 16C:
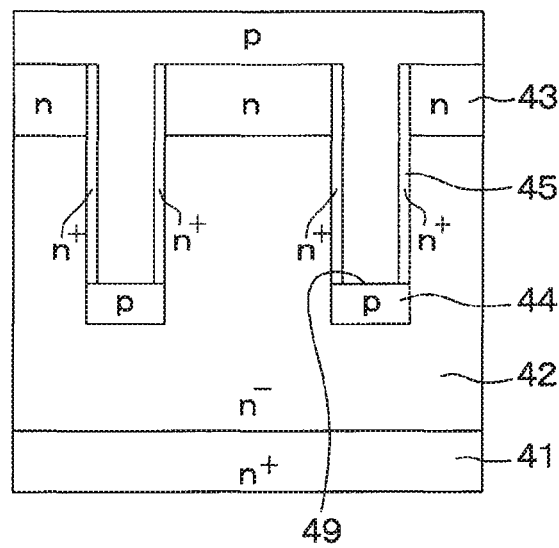
Figure 16B:
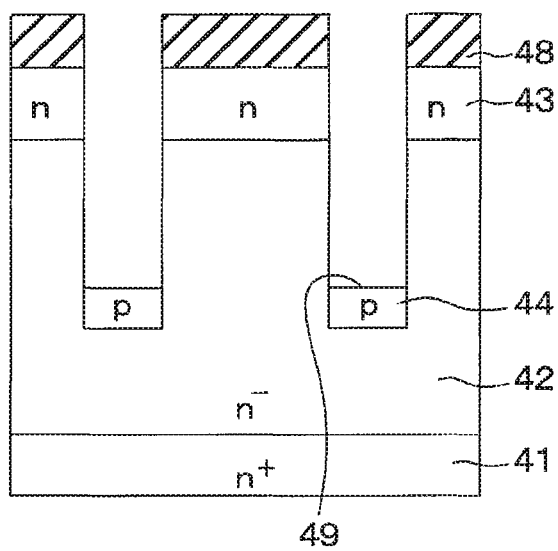

[Step Shown in FIG. 16B]

A mask member 48 is disposed on the front face of the n−-type drift layer 42. Subsequently, predetermined positions for forming the deep layer 44 and the limiting layers 45 are opened in the mask member 48 by photolithography. In the state that the mask member 48 is disposed, anisotropic etching such as RIE is performed to form a deep trench 49 at the predetermined positions for forming the p-type deep layer 44 and the limiting layers 45. The n$^+$-type substrate 41 has the front face constituted by (0001) Si face, while the n$^-$-type drift layer 2 formed on the n$^+$-type substrate 41 has the same plane orientation. Accordingly, the deep trench 49 formed in this step has a bottom face constituted by (0001) Si face, and a side face constituted by a face or m face, such as (1-100) face. Subsequently, p-type dopant, such as aluminum, is ion-implanted in a covered state by the mask member 48 to form a part of the deep layer 44 on the bottom of the deep trench 49.

[Step Shown in FIG. 16C]

After removal of the mask member 48, a step similar to the step in FIG. 2C is performed. This step fills the inside of the deep trench 49 with a remaining part 44b of the deep layer 44 and the limiting layers 45, thereby producing such a structure that includes the limiting layers 45 respectively provided on side faces of the deep layer 44, and an ion-implanted part of the deep layer 44 provided on the bottom of the deep trench 49.

Figure 16D:
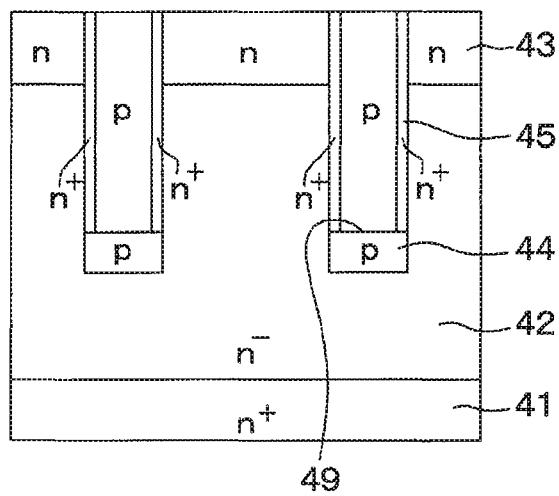

[Step Shown in FIG. 16D]

A p-type SiC layer formed on a front face of the n-type layer 43 and constituting the deep layer 44 is removed by grinding, CMP, or other methods to expose the n-type layer 43.

Subsequent steps (not shown) are performed, including a step for forming the Schottky electrode 46 on front faces of the n-type layer 43, the deep layer 44, and the limiting layers 45, and a step for forming the ohmic electrode 47 on the rear face of the n$^+$-type substrate 41 to complete the SiC semiconductor device including the vertical JBS illustrated in FIG. 15.

As described above, the structure including the deep layer 44 and the limiting layers 45 is similarly applicable to the SiC semiconductor device including the vertical JBS. At the time of formation of the deep layer 44 and the limiting layers 45, a dopant gas containing p-type dopant, and a dopant gas containing n-type dopant are both introduced to simultaneously form the deep layer 44 and the limiting layers 45 similarly to the first embodiment. More specifically, by utilizing plane orientation dependency of a p-type SiC layer and an n-type SiC layer during epitaxial growth, the deep layer 44 is formed from the bottom side of the deep trench 49, while the limiting layers 45 are formed on the side faces of the deep trench 49. In this manner, accurate formation of the vertical JBS, which has the structure including the limiting layers 45 on the side faces of the deep layer 44 as illustrated in FIG. 15, is achievable.

(Other Embodiments)

Although the present disclosure is described based on the above embodiments, the present disclosure is not limited to the embodiments and the structures. Various changes and modification may be made in the present disclosure. Furthermore, various combination and formation, and other combination and formation including one, more than one or less than one element may be made in the present disclosure.

For example, according to the respective embodiments described above, the n$^+$-type source area 4 is formed by epitaxial growth. However, the n$^+$-type source area 4, which is only required to be formed in an upper layer part of the base area 3, may be formed by other methods such as ion implantation.

According to the second embodiment, the base area 3 is divided into the high-concentration base area 3a and the low-concentration base area 3b. However, the base area 3 may have a uniform impurity concentration. According to the configuration having different impurity concentrations, the impurity concentration may gradually change in the boundary portion between the high-concentration base area 3a and the low-concentration base area 3b. In this case, the high-concentration base area 3a and the low-concentration base area 3b having different p-type impurity concentrations may be laminated on each other with the boundary portion interposed between the high-concentration base area 3a and the low-concentration base area 3b. In a different mode, the low-concentration base area 3b may be constituted by an i-type semiconductor in a non-doped state, i.e., in a state containing substantially no p-type dopant. For example, the dope quantity of the low-concentration base area 3b may be only a quantity sufficient for doping p-type dopant remaining in the atmosphere during epitaxial growth. In this case, channel mobility in the low-concentration base area 3b further increases, wherefore on-resistance further decreases.

According to the respective embodiments described herein by way of example, the n$^-$-type drift layer 2 is formed on the front face of the n$^+$-type substrate 1 to constitute a structure of a semiconductor substrate that includes a higher impurity concentration rear face layer on the rear face side, and a drift layer disposed on the front face side and having an impurity concentration lower than the impurity concentration of the rear face layer. However, this structure is presented only by way of example of the semiconductor substrate. For example, the semiconductor substrate may include a high-concentration impurity layer produced by ion implantation of n-type dopant or by epitaxial growth on a rear face side of a substrate constituted by the n$^-$-type drift layer 2.

According to the n-channel type vertical MOSFET in the respective embodiments described herein by way of example, n-type is designated as a first conductive type, while p-type is designated as a second conductive type. However, the present disclosure is applicable to a p-channel type vertical MOSFET that includes constituent elements whose conductive types are inverted. In this case, (000-1) carbon face is designated as a plane orientation of a front face of a semiconductor unlike the respective embodiments described above to allow dominant epitaxial growth of p-type limiting layers on side faces of a deep trench, and dominant epitaxial growth of an n-type deep layer on a bottom of the deep trench.

According to the respective embodiments described above by way of example, SiC is adopted as a compound semiconductor. The p-type deep layer 5 formed on the n$^-$-type drift layer 2 as a foundation layer is presented by way of example of epitaxial growth of a second conductive type deep layer within a deep trench. However, this configuration is also presented only by way of example. The present disclosure is applicable to a structure that includes a deep trench formed for a first conductive type foundation layer containing a compound semiconductor, and a deep layer constituted by a second conductive type compound semiconductor and formed by epitaxial growth within the deep trench.

For expressing a crystal orientation, a bar (-) should be given above a desired numeral under ordinary circumstances. In the present description, however, a bar is given before a desired numeral in consideration of expressive limitations imposed on electronic applications.

The invention claimed is:

1. A method for manufacturing a compound semiconductor device, the method comprising:

providing a semiconductor substrate that includes a foundation layer having a first conductive type and formed of a compound semiconductor, wherein the compound semiconductor includes silicon carbide;

forming a deep trench in the foundation layer; and filling the deep trench with a deep layer having a second conductive type and a limiting layer having the first conductive type by:

introducing dopant gas that contains first conductive type dopant, dopant gas that contains second conductive type dopant, and material gas of the compound semiconductor into an epitaxial growth device;

forming the deep layer from a bottom of the deep trench toward an opening inlet of the deep trench; and causing epitaxial growth of the limiting layer on a side face of the deep trench, the limiting layer limiting a depletion layer that extends from a side face of the deep layer to the foundation layer, wherein in the filling the deep trench, the forming of the deep layer from the bottom of the deep trench toward the opening inlet of the deep trench and growth of the limiting layer on the side face of the deep trench comprising simultaneously epitaxially growing the deep layer having the second conductive type in the deep trench and epitaxially growing the limiting layer having the first conductive type more easily than the deep layer having the second conductive type on the side face of the deep trench, based on plane orientation dependency of the compound semiconductor during epitaxial growth.

2. The method for manufacturing the compound semiconductor device according to claim 1, wherein the filling the deep trench includes:

forming a part of the deep layer on the bottom of the deep trench by introducing the dopant gas that contains the second conductive type dopant and the material gas of the compound semiconductor into the epitaxial growth device; and causing the simultaneous epitaxial growth of the deep layer and the limiting layer after the forming the part of the deep layer by simultaneously introducing both the dopant gas that contains the first conductive type dopant and the dopant gas that contains the second conductive type dopant, and the material gas of the compound semiconductor into the epitaxial growth device.

3. The method for manufacturing the compound semiconductor device according to claim 2, wherein the forming the part of the deep layer includes:

forming the second conductive type layer on the bottom and the side face of the deep trench; and removing a part of the second conductive type layer located on the side face of the deep trench and leaving a part of the second conductive type layer located on the bottom of the deep trench by reducing an introduction amount of the material gas to an amount less than an introduction amount of the material gas for forming the second conductive type layer, and thereby forming the part of the deep layer.

4. The method for manufacturing the compound semiconductor device according to claim 1, the method further comprising:

forming the second conductive type layer that constitutes a part of the deep layer by ion implantation of second conductive type dopant into the bottom of the deep trench, wherein the filling the deep trench is performed after the forming the second conductive type layer, and the deep layer formed by the filling the deep trench includes the second conductive type layer formed by the ion implantation and a part formed by the epitaxial growth.

5. The method for manufacturing the compound semiconductor device according to claim 1, wherein the first conductive type is n-type, the second conductive type is p-type, and the filling the deep trench includes performing pre-doping to preliminarily introduce dopant gas that contains an organic metal material constituting p-type dopant before the introducing the material gas into the epitaxial growth device.

6. The method for manufacturing the compound semiconductor device according to claim 1, wherein trimethylaluminum is used as the dopant gas that contains the second conductive type dopant.

7. The method for manufacturing the compound semiconductor device according to claim 1, wherein nitrogen is used as the dopant gas that contains the first conductive type dopant.

8. The method for manufacturing the compound semiconductor device according to claim 1, the method further comprising:

providing the semiconductor substrate that is formed of a compound semiconductor, and includes a rear face layer disposed on a rear face side of the semiconductor substrate and a drift layer disposed on a front face side of the semiconductor substrate, the drift layer having the first conductive type and an impurity concentration lower than the rear face layer, and corresponding to the foundation layer;

forming a base area on the drift layer, the base area being formed of a compound semiconductor;

forming a source area above the base area, the source area being formed of a compound semiconductor having the first conductive type and having an impurity concentration higher than the drift layer;

forming a gate trench that extends from a front face of the source area to a position deeper than the base area;

forming a trench gate structure by forming a gate insulation film on an inner wall surface of the gate trench and forming a gate electrode on the gate insulation film;

forming a source electrode that is electrically connected to the source area; and forming a drain electrode that is electrically connected to the rear face layer disposed on the rear face side of the semiconductor substrate, wherein the filling the deep trench includes forming the deep trench in the drift layer and filling the deep trench with the deep layer and the limiting layer.

9. The method for manufacturing the compound semiconductor device according to claim 1, the method further comprising:

providing the semiconductor substrate that is formed of a compound semiconductor, and includes a rear face layer disposed on a rear face side of the semiconductor substrate and a drift layer disposed on a front face side of the semiconductor substrate, the rear face layer having a higher impurity concentration and the drift layer having an impurity concentration lower than the rear face layer, the drift layer having the first conductive type and corresponding to the foundation layer;

forming a first conductive type high concentration layer on the drift layer, the first conductive type high concentration layer being formed of a compound semiconductor having an impurity concentration higher than the drift layer;

forming a Schottky electrode that is in contact with the first conductive type high concentration layer; and forming a back electrode that is in contact with the rear face layer, wherein the filling the deep trench includes forming the deep trench that penetrates the first conductive type high concentration layer and reaches the drift layer, and filling the deep trench with the deep layer and the limiting layer.

* * * * *